United States Patent
Moyer (10) Patent No.: US 8,990,657 B2
(45) Date of Patent: Mar. 24, 2015

(54) SELECTIVE MASKING FOR ERROR CORRECTION

(75) Inventor: William C. Moyer, Dripping Springs, TX (US)

(73) Assignee: Freescale Semiconductor, Inc., Austin, TX (US)

(*) Notice: Subject to any disclaimer, the term of this patent is extended or adjusted under 35 U.S.C. 154(b) by 177 days.

(21) Appl. No.: 13/159,878

(22) Filed: Jun. 14, 2011

(65) Prior Publication Data

US 2012/0324312 A1 Dec. 20, 2012

(51) Int. Cl.
*G11C 29/00* (2006.01)
*G06F 11/10* (2006.01)
*H03M 13/13* (2006.01)

(52) U.S. Cl.
CPC ............ *G06F 11/1004* (2013.01); *H03M 13/13* (2013.01)
USPC .......................................... 714/763

(58) Field of Classification Search
USPC .......................................... 714/763, E11.034
See application file for complete search history.

(56) References Cited

U.S. PATENT DOCUMENTS

| | | | |
|---|---|---|---|
| 3,814,922 A | 6/1974 | Nibby et al. | |
| 4,768,197 A | 8/1988 | Petolino et al. | |
| 4,897,839 A | 1/1990 | Yamagishi et al. | |
| 5,099,484 A | 3/1992 | Smelser | |
| 5,146,461 A | 9/1992 | Duschatko et al. | |
| 5,173,905 A * | 12/1992 | Parkinson et al. | 714/768 |
| 5,375,127 A | 12/1994 | Leak et al. | |
| 5,430,742 A | 7/1995 | Jeddeloh et al. | |
| 5,848,293 A | 12/1998 | Gentry | |
| 5,954,831 A | 9/1999 | Chang | |
| 5,978,953 A * | 11/1999 | Olarig | 714/768 |
| RE36,448 E | 12/1999 | Brady | |
| 6,253,273 B1 | 6/2001 | Blumenau | |
| 6,480,975 B1 | 11/2002 | Arimilli et al. | |
| 6,772,383 B1 | 8/2004 | Quach et al. | |
| 6,880,112 B2 | 4/2005 | Lajolo | |
| 6,954,826 B2 | 10/2005 | Moyer | |
| 7,069,494 B2 | 6/2006 | Cargnoni et al. | |
| 7,257,762 B2 | 8/2007 | Holm et al. | |
| 7,272,773 B2 | 9/2007 | Cargnoni et al. | |
| 7,334,179 B2 | 2/2008 | Zhang et al. | |
| 7,337,352 B2 | 2/2008 | DeSota | |
| 7,376,877 B2 | 5/2008 | Quach et al. | |
| 7,398,449 B1 | 7/2008 | Normoyle et al. | |

(Continued)

OTHER PUBLICATIONS

Title: Post-Manufacturing ECC Customization Based on Orthogonal Latin Square Codes and Its Application to Ultra-Low Power Caches; Author: Rudrajit Datta and Nur A. Touba; Published Date 2010; Publisher: IEEE, 978-1-4244-7207-9/10 under International Test Conference.*

(Continued)

*Primary Examiner* — April Y Blair
*Assistant Examiner* — Thien D Nguyen (57) ABSTRACT

Error correction code (ECC) checkbits are generated for each write access to a memory address based on both the data to be written (the write data) and the memory address. The data processing device employs multiple-mapped or multi-port memory, whereby different memory addresses can be associated with the same memory location. To generate the ECC checkbits the data processing device selects a mask for each write access based on the write address and determines the ECC checkbits based on the write data, the write address, and the mask.

20 Claims, 5 Drawing Sheets

(56) References Cited

U.S. PATENT DOCUMENTS

| | | |
|---|---|---|
| 7,409,502 B2 | 8/2008 | Moyer et al. |
| 7,437,597 B1 | 10/2008 | Kruckemyer et al. |
| 7,480,847 B2 | 1/2009 | Schulz |
| 7,506,226 B2 | 3/2009 | Gajapathy et al. |
| 7,526,713 B2 | 4/2009 | Klein |
| 7,568,146 B2 | 7/2009 | Takahashi et al. |
| 7,617,437 B2 | 11/2009 | Moyer |
| 7,900,100 B2 | 3/2011 | Gollub |
| 7,996,727 B2 | 8/2011 | Radke |
| 8,276,039 B2 | 9/2012 | Wuu et al. |
| 8,291,305 B2 | 10/2012 | Moyer et al. |
| 2003/0188251 A1 | 10/2003 | Brown et al. |
| 2005/0240745 A1 | 10/2005 | Iyer et al. |
| 2005/0257025 A1 | 11/2005 | Spencer |
| 2006/0010339 A1 | 1/2006 | Klein |
| 2006/0031739 A1 | 2/2006 | Gan et al. |
| 2006/0117239 A1 | 6/2006 | Lin et al. |
| 2006/0236205 A1 | 10/2006 | Kuramoto et al. |
| 2007/0136647 A1* | 6/2007 | Kanai et al. ............... 714/785 |
| 2007/0150671 A1 | 6/2007 | Kurland |
| 2007/0266297 A1 | 11/2007 | Liang et al. |
| 2007/0277085 A1 | 11/2007 | Goessel et al. |
| 2008/0016428 A1 | 1/2008 | Lee et al. |
| 2008/0055125 A1 | 3/2008 | Cideciyan et al. |
| 2008/0109705 A1 | 5/2008 | Pawlowski et al. |
| 2008/0162829 A1 | 7/2008 | Scott et al. |
| 2008/0235558 A1* | 9/2008 | Normoyle et al. ............ 714/757 |
| 2008/0294840 A1 | 11/2008 | Bliss et al. |
| 2009/0049350 A1 | 2/2009 | Parris et al. |
| 2009/0100315 A1 | 4/2009 | Lee |
| 2009/0158120 A1 | 6/2009 | Palanki et al. |
| 2009/0249148 A1 | 10/2009 | Ito et al. |
| 2009/0307537 A1 | 12/2009 | Chen et al. |
| 2010/0106872 A1 | 4/2010 | Moyer et al. |
| 2010/0107243 A1 | 4/2010 | Moyer et al. |
| 2011/0040924 A1 | 2/2011 | Selinger |
| 2011/0138252 A1 | 6/2011 | Pawlowski et al. |
| 2012/0066567 A1 | 3/2012 | Moyer et al. |
| 2012/0166904 A1 | 6/2012 | Bandholz |

OTHER PUBLICATIONS

Non-Final Office Action mailed Jan. 18, 2013 for U.S. Appl. No. 13/097,721, 29 pages.

U.S. Appl. No. 12/886,641, filed Sep. 21, 2010, entitled "Data Propcessor for Processing Decorated Instructions with Cache Bypass,".

U.S. Appl. No. 13/053,962, filed Mar. 22, 2011, entitled "Selective Checkbit Modification for Error Correction,".

U.S. Appl. No. 13/097,721, filed Apr. 29, 2011, entitled "Selective Error Detection and Error Correction for a Memory Interface,".

Notice of Allowance mailed Jun. 18, 2013 for U.S. Appl. No. 13/053,962, 26 pages.

Final Office Action mailed May 15, 2013 for U.S. Appl. No. 13/159,878, 10 pages.

Notice of Allowance mailed Jul. 24, 2013 for U.S. Appl. No. 13/097,721, 6 pages.

Non-Final Office Action mailed Dec. 19, 2013 for U.S. Appl. No. 12/880,352, 8 pages.

Final Office Action mailed Jul. 16, 2014 for U.S. Appl. No. 12/880,352, 8 pages.

* cited by examiner

SELECTIVE MASKING FOR ERROR CORRECTION

FIELD OF THE DISCLOSURE

The present disclosure relates generally to data processing devices, and more particularly to error detection and correction for data processing devices.

BACKGROUND

Data processing operations frequently involve transfers of data between endpoints, whereby a data source provides the data for transfer and a data sink subsequently receives the data. A memory device is typically employed to temporarily store the transferring data between the data source and data sink. However, the transfer and storage of the data at the memory device can introduce errors in the data. For example, a faulty memory portion can cause bits of the data to be represented at the memory device in an incorrect state. Accordingly, some data processing systems employ error correction techniques whereby error correction code (ECC) checkbits are calculated for each segment of data stored at the memory device. In response to a request to transfer data from the memory to a data sink, the ECC checkbits stored in the memory are used to detect and correct errors in the data received responsive to the request. However, in certain data processing systems, the memory device does not detect errors in the data that result from the transfer of data to the processor unit. Accordingly some data processing devices employ end-to-end (e2e) error detection and correction, whereby ECC checkbits are generated at the data source and error detection is performed at the data sink. This allows for detection and correction of errors resulting both from temporary storage of data as well as errors resulting from data transfer.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-6 illustrate example techniques for performing error detection and correction at a data processing device. Error correction code (ECC) checkbits are generated for each write access to a memory address based on both the data to be written (the write data) and the memory address. In response to a read access requesting data (the read data) at the memory address, the ECC checkbits are employed to check for errors in both the address and the read data. In addition, the data processing device employs multiple-mapped or multi-port memory, whereby different memory addresses can be associated with the same memory location. Accordingly, there can be mismatches between the memory address employed to write to a memory location and the address employed to read from the memory location. Because the ECC checkbits are based in part on the memory address, such address mismatches can cause error detection problems, such as false detection of errors. Therefore, to generate the ECC checkbits the data processing device selects a mask for each write access based on the write address to mask out bit locations whose value can vary between addresses associated with a multiple-mapped memory location. The data processing device determines the ECC checkbits based on the write data, the write address, and the mask.

To illustrate, the different addresses associated with a multiple-mapped memory location can differ at particular bit locations, referred to herein as the mismatch bits. The mask is selected so that potential mismatch bits are prevented from impacting the result of an ECC checkbit calculation. The calculated ECC checkbits will therefore be based only on address bits that do not vary between the addresses associated with the multiple-mapped memory location. Therefore, the ECC checkbits will be the same for any write access to the multiple-mapped memory location regardless of the particular address associated with an access, thereby maintaining the robustness of the error detection and correction process.

Figure 1:
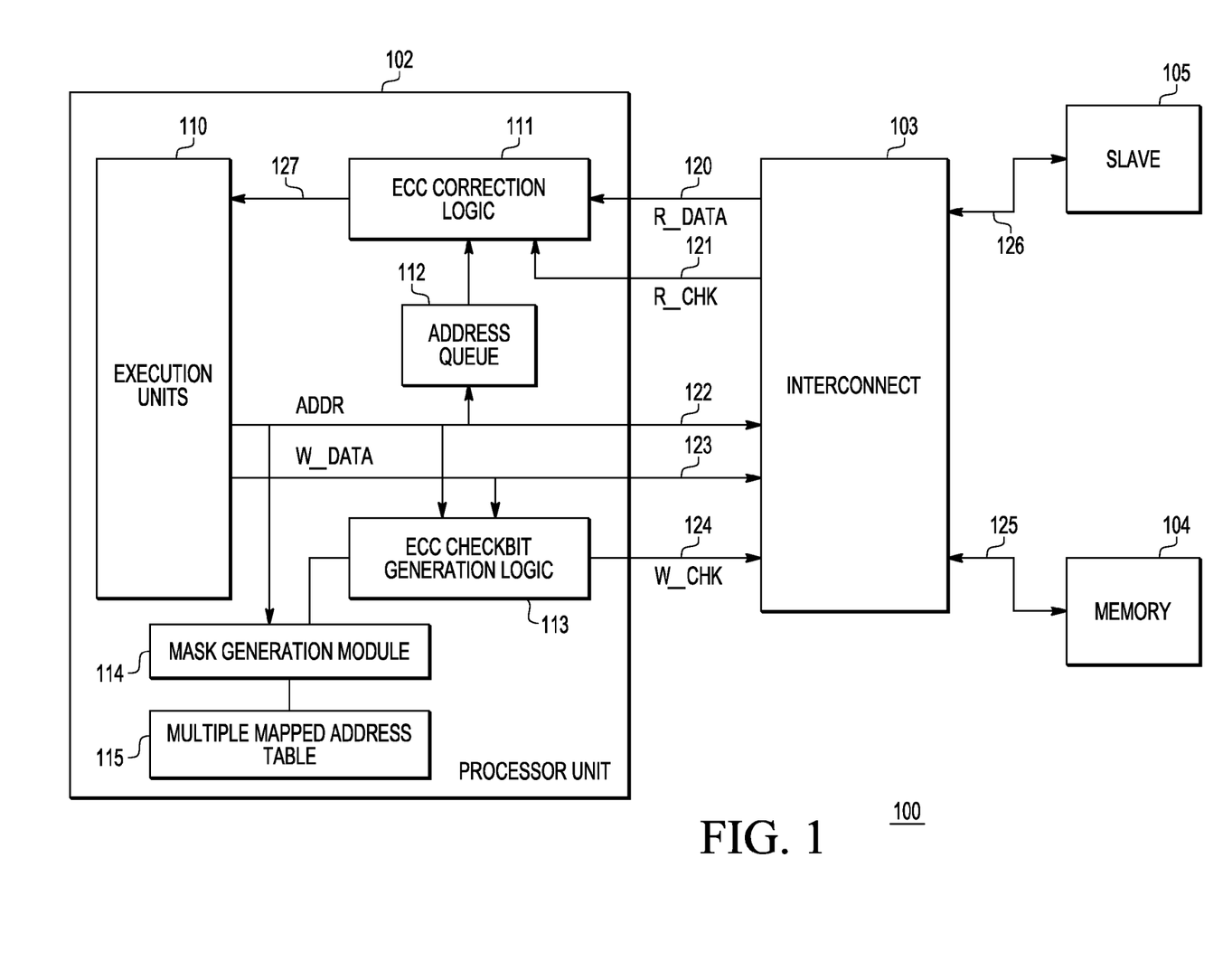
FIG. 1 is a block diagram illustrating a data processing device in accordance with a specific embodiment of the present disclosure.

FIG. 1 illustrates a data processing device 100 in accordance with one embodiment of the present disclosure. In the embodiment illustrated at FIG. 1, the data processing device 100 is a general purpose data processing device that can be incorporated into an electronic device, such as a portable electronic device, computer devices, automotive device, and the like. The data processing device 100 is generally configured to decode a set of instructions into one or more operations, and execute the operations in order to perform tasks associated with the electronic system. For example, the data processing device 100 can be incorporated in a mobile telephone device, and execute sets of instructions to send and receive phone calls, access the Internet, send and receive text messages, and the like.

As described further herein, the data processing device 100 employs an end-to-end error detection and correction scheme. To illustrate, a data source at the data processing device 100 generates data to be stored at a memory address. Based on both the data and the address, the data source generates a set of ECC checkbits, and provides both the data and the ECC checkbits to a memory device for storage at the memory address. The combined data and checkbits are stored as a codeword. A typical codeword might consist of 64 data bits and 8 checkbits, where the checkbits are calculated according to a particular coding scheme using the 64 data bits as well as the memory address value (or a portion thereof) of the location the data is stored. A data sink can access the stored data by providing the memory address to the memory device, which in response provides both the stored data and the associated ECC checkbits. The data sink performs error detection and correction using the ECC checkbits based on the predetermined coding scheme. The data sink can therefore detect errors both in the stored data and in the memory address provided to the memory device.

The data processing device 100 employs multiple-mapped or multi-port memory, such that the same memory location can be concurrently associated with two or more memory addresses. As used herein, a memory address is associated with a memory location if an access to the memory address (read or write access) results in an access to the memory location. A memory location that is concurrently associated with more than one memory addresses is referred to as a multiple-mapped memory location. For some multiple-mapped memory location, conventional e2e ECC techniques can result in error detection problems, such as false error detections. To illustrate, in an embodiment a multiple-mapped memory location is associated with two addresses, designated Address A and Address B. According to conventional ECC techniques, a write to the memory location based on a write access to Address A will result in generation of ECC checkbits based on Address A. However, a subsequent read access to the memory location based on Address B will result in an error detection and correction process based on Address B. In other words, there is the potential for an address mismatch between the write access and the read access to the same memory location. Such a mismatch can result in error detection problems.

Accordingly, for each write access, the data processing device 100 determines a mask based on the write address and determines the ECC checkbits based on the write data, the write address, and the mask. In an embodiment, the ECC checkbits are nominally determined by combining selected ones of the write data bits and the write address bits according to a series of exclusive-or (XOR) operations, where the selected bits are defined by a matrix, referred to as an H-matrix. The mask is selected to modify the H-matrix for the write access, such that mismatch bits of the write address do not impact the result of the ECC checkbit calculation.

Referring again to FIG. 1, the data processing device 100 includes a processor unit 102, an interconnect 103, a memory device 104, and a slave device 105. The processor unit 102 is connected to the interconnect 103 via a set of busses, labeled bus 120 through bus 124, while the memory 104 is connected to the interconnect 103 via a bus 125. The slave device 105 is connected to the interconnect 103 via a bus 126.

The processor unit 102 is a module configured to decode processor instructions into one or more operations and execute the operations in order to perform the functions of the data processing device 100. For example, in one embodiment the data processing device 100 is part of an automobile control system, and the processor unit 102 executes operations to control aspects of the automobile's functions, such as detection of automobile conditions, management and control of different automotive features, and the like.

An example operation that can be executed by the processor unit 102 is referred to as a memory access, whereby the processor unit 102 provides data to be transferred to a memory device (a write access) or requests data to be transferred from the memory device to the unit (a read access). In addition, the processor unit performs error detection and correction functions for the data transfer operations.

To illustrate, for a write access, the processor unit 102 provides, via bus 123, the data to be transferred (the write data, W_DATA) and provides, via bus 122, an address (ADDR) of the memory location to which the write data is to be transferred. In addition, the processor unit 102 can generate a set of ECC checkbits based on both the address and the write data and provide the set of ECC checkbits via the bus 124 (W_CHK). As described further herein, the ECC checkbits can be used by a data sink to detect and correct errors in both the write data and the address.

For a read access, the processor unit 102 provides, via bus 122 the address of the location of the data to be transferred (the read data, R_DATA). In response, the processor unit 102 receives, via bus 120, the read data and receives, via bus 121, the set of ECC checkbits (R_CHK) associated with the read data and the address. The processor unit 102 can perform error correction and detection on the read data and address using the received ECC checkbits.

The interconnect 103 is a communication link configured to transfer information between the processor unit memory 102, the memory device 104, the slave device 105, and other devices (not shown). Accordingly, the interconnect 103 can manage communication overhead features, such as communication routing, buffering, flow control, bus management, communication acknowledgement, and the like. The interconnect 103 can also manage other device functions, such as interrupt signaling, memory coherency, and the like.

The memory device 104 includes memory locations configured to store information, and retrieve stored information, based on address information, data information, and control signaling, all received via the bus 125. In particular, in response to a write access, as indicated by an address, write data, ECC checkbits, and associated control signaling received via bus 125, the memory 104 can store the write data and ECC checkbits at a memory location corresponding to the address. In response to a read access, as indicated by an address and associated control signaling received via bus 125, the memory 104 retrieves the read data and ECC checkbits stored at the indicated memory location and provides the retrieved information via the bus 125. One or more of the memory locations of the memory device 104 are multiple-mapped memory locations. While not shown, memory device 104 may consist of different blocks of storage locations which have differing multiple-mapping or multi-porting characteristics. Also, multiple memory device 104 modules may be present in data processing device 100. In the illustrated embodiment, the processor unit 102 maintains a multiply mapped address table 115 that stores a list of the memory locations that have multiple-mapping or multi-porting characteristics, and the multiple memory address associated with each memory location. In an embodiment, the multiply mapped address table 115 is created, modified, and maintained by an operating system or other system management software executing at the processor unit 102, or may be implemented in hardware, such as with hardwired logic, a programmable logic module, or a combination of hardware and software created mappings.

The slave 105 is a device, such as an input/output device, configured to receive and provide information via the bus 126. The received information can be employed to send the slave 105 commands, configure operation of the slave 105, and the like. The provided information can include command responses, device status information, and the like.

The processor unit 102 includes execution units 110, ECC correction logic 111, address queue 112, ECC, checkbit generation logic 113, and mask generation module 114. The execution units 110 are connected to busses 120 and 121 and to ECC correction logic 111 via a bus 127. The address queue 112 is connected to the bus 122 and to the ECC correction logic 111. The ECC correction logic 111 is also connected to the busses 120 and 121. The ECC checkbit generation logic 113 is connected to the busses 122-124. The mask generation module 114 is connected to the bus 122 and the ECC checkbit generation logic 113. Although not shown, ECC correction logic 111 may also contain mask generation logic to be applied to the read address on a read of a multiple-mapped memory location, or alternatively, the memory device may respond with checkbits which correspond to the particular values of the mismatch address bits such that no mask generation logic is required by ECC correction logic 111. The ECC correction logic 111 can also be connected to the multiply-mapped address table 115 to allow the logic to determine whether the read address is associated with a multiply-mapped memory location.

The execution units 110 are a part of an instruction pipeline (not shown) of the processing unit 102, and execute operations, including data transfer operations, dispatched by the pipeline. Accordingly, for write accesses, the execution units 110 determine both the memory address and the data associated with the operation, provides the memory address via bus 122 and the write data via the bus 123. For read accesses the execution units 110 determine the memory address to be read, provide the determined memory address via the bus 122, and receive the data associated with the memory address via the bus 127. The execution units 110 can perform further operations on the received data, provide the data to other modules of the processor unit 102, and the like.

The address queue 112 is a first-in first out (FIFO) storage module that retrieves, from the bus 122, and stores memory addresses associated with read accesses. In an embodiment, the address queue determines that a memory address provided via the bus 122 is associated with a read access based on control signaling (not shown) provided by the execution units 110. Address queue 112 maintains a set of one or more memory access addresses associated with outstanding (i.e. in-progress) read transactions issued by processor unit 102 to the interconnect 103 for processing by memory unit 104, slave unit 105, or other units within data processing system 100 (not shown).

The ECC checkbit generation logic 113 generates ECC checkbits for write accesses. In particular, during a write access, the ECC checkbit generation logic is provided to the memory address where the write data is to be written (the write address) via the bus 122 and is provided the write data via the bus 123. Based on both the write address and the write data, the ECC checkbit generation logic 113 generates checkbits according to a conventional ECC checkbit generation technique, such as using a Hamming-based error correction matrix, or using a similar Hsaio coding scheme. Other error correction coding schemes such as Reed-Solomon or Bose-Chaudhuri-BCH codings may also be employed. In one embodiment, the ECC checkbit generation module 113 calculates one set of checkbits, referred to as data checkbits, based on the write data and calculates another set of checkbits, referred to as address checkbits, based on the write address. The ECC checkbit module 113 combines the address checkbits and the write checkbits according to a logical operation, such as an XOR operation, to determine the final set of ECC checkbits to be provided via the bus 124.

In an embodiment, the ECC checkbit generation logic calculates the ECC checkbits based on an H-matrix. This can be better understood with reference to FIG. 2, which illustrates an H-matrix 200. The H-matrix 200 includes a data section 201 and an address section 202. The rows of the checkbit matrix are each associated with the correspondingly numbered checkbit, while the columns are each associated with a corresponding bit of the data or address. An asterisk in a matrix entry, such as entry 203, indicates that the corresponding bit of the data or address is employed to generate the corresponding data or address checkbit, respectively. Thus, for example, address checkbit 7 is generated based on address bits 30, 28, 26, 24, 23, 22 20, 19, 18, 16, 15, 14, 12, 10, 8, 7, 6, and 4. The indicated bits can be combined according to a set of logical operations, such as XOR operations, to determine the corresponding ECC checkbit.

Figure 2:
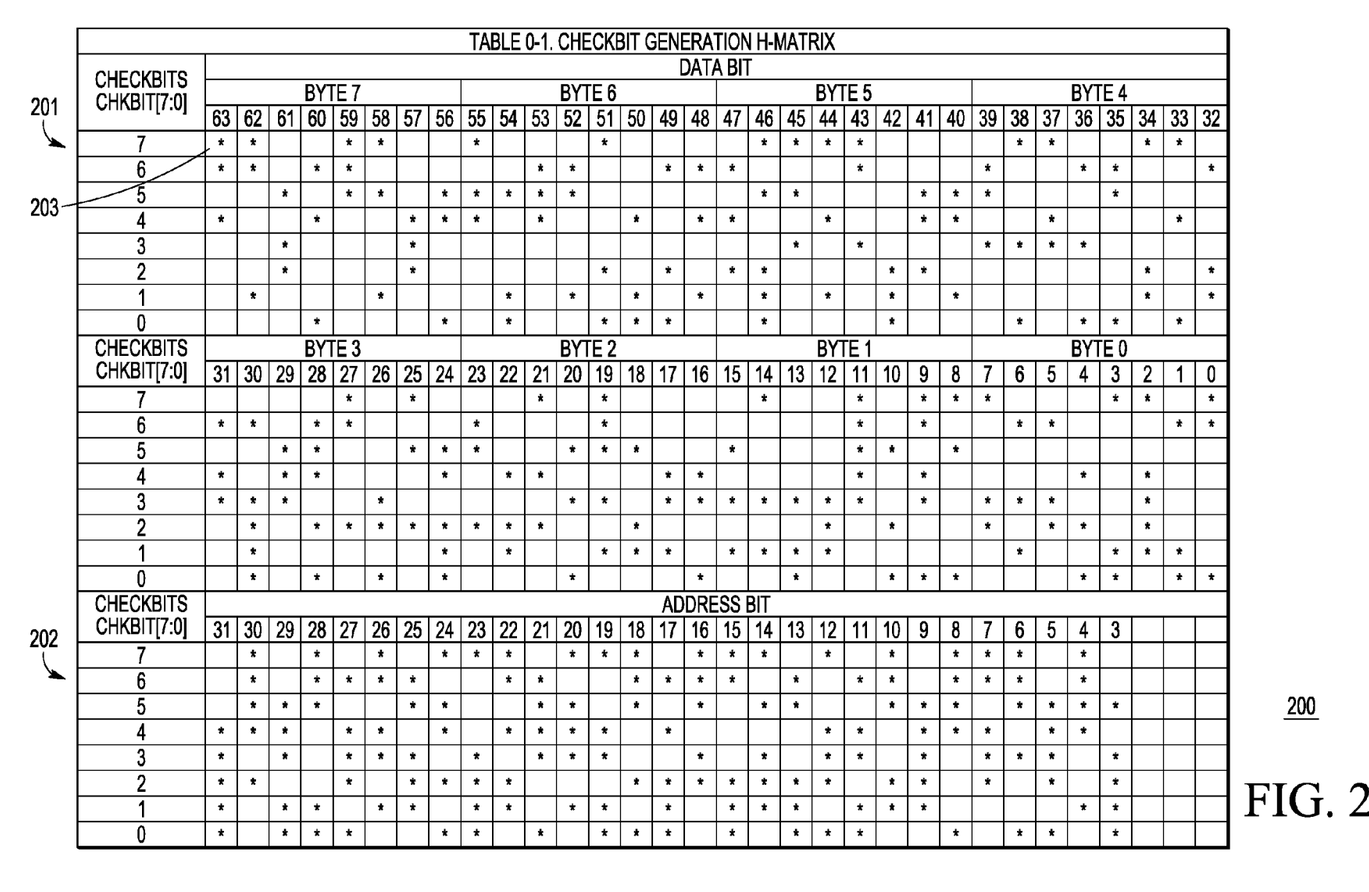
FIG. 2 is a diagram of a checkbit generation matrix employed by the ECC checkbit generation logic of FIG. 1 in accordance with one embodiment of the present disclosure.

For each write access, the mask generation module 114 determines, based on the write address, a mask that prevents address mismatch bits from impacting the result of the ECC checkbit calculation. This can be better understood with reference to FIG. 3, which illustrates a method of determining a mask in accordance with one embodiment of the present disclosure. At block 302, a memory address is selected. At block 303, the first address bit of the memory address is selected. At block 304, it is determined whether inclusion of the selected address bit in the ECC checkbit calculation has the potential cause an error detection problem. For example, it can be determined, based on multiple-mapped address table 115, for which bit locations the selected memory address differs from other memory addresses that are associated with the memory location associated with the selected memory address. For each of these bit locations, it is determined whether, based on the H-matrix 200, the bit location is employed to calculate one of the address checkbits. If so, the bit location is identified as a bit location that could cause an error detection problem. In response, the method flow moves to block 305 and a mask is generated such that, when the mask is combined with either the memory address or the address checkbits, the selected bit location will not impact the result of the final ECC checkbit calculation. If the selected bit location is not determined to have the potential to cause an error detection problem, the mask is generated so that the selected bit location can impact the result of the ECC checkbit calculation. Note that in an embodiment, most if not all of the address mismatch bits for a particular memory location will affect at least one of the checkbits, thus, for the embodiment, the flow of FIG. 3 will generate a mask corresponding to the locations of the mismatch address bits for that memory location. In an alternate embodiment, one or more of the mismatch address bits may not affect any of the checkbits, and thus may be excluded from the masking function. Also note that due to different multiple-mappings for various memory locations which may be present in data processing device 100, different sets of address mismatch bits may be calculated depending on the address value.

In one embodiment, the mask is generated such that the mismatch bits, when combined with the mask according to a specified operation, will result in the mismatch bits being set to a specified value, such as all logical zeroes or all logical ones. To illustrate, in an embodiment two addresses, designated Address A and Address B, are associated with a common memory location. In this example, Address A is 1011000000100001 and Address B is 1001000000100001. Thus, the addresses have a mismatch bit at bit position 13. Further, it is assumed for purposes of this example that the generated mask is to be combined with the address via a logical AND operation, and that any mismatch bits are to be masked to be set to zero. Accordingly, if it is determined that this difference at bit position 13 could impact the result of ECC checkbit calculation, the mask is generated for Address A and Address B to be 1101111111111111.

In another embodiment, the mask is generated such that only a submatrix of the H-matrix 200 is employed to determine the ECC checkbits. For example, assuming Address A and Address B have mismatch bits at position 5, 7, and 15, the corresponding columns of H-matrix 200 (columns 5, 7, and 15) can be combined with the original H-matrix 200 according to an exclusive-OR operation, resulting in an H-matrix whereby columns 5, 7, and 15 of the resulting matrix indicate that these bit positions should not be employed in the ECC checkbit calculation. The mismatch bits are thereby effectively removed from the ECC checkbit calculation.

Figure 3:
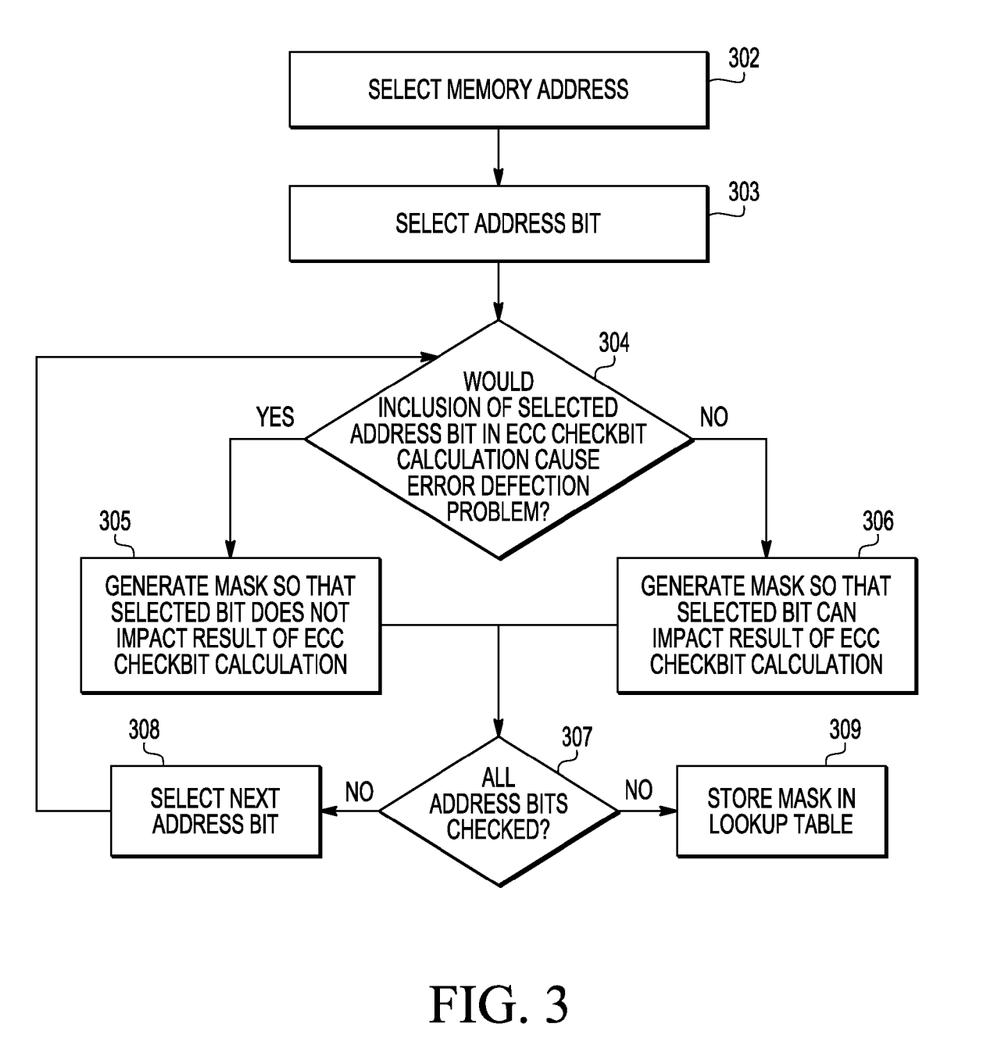
FIG. 3 is a flow diagram of a method of determining a mask for generating ECC checkbits at the data processing device of FIG. 1 in accordance with one embodiment of the present disclosure.

At block 307, it is determined whether all address bit locations have been checked. If not, the method flow moves to block 308 and the next bit location of the address is selected. If all bit locations have been checked, the method flow moves to block 309 and the final mask is stored in a lookup table. In an embodiment, the lookup table is stored at the mask generation module 114. In response to receiving a write address, the mask generation module looks up the mask associated with the write address and provides the mask to the ECC checkbit logic 113. In response, the ECC checkbit logic 113 calculates the final ECC checkbits based on the mask.

In an embodiment, different portions of memory, or different memory modules may have differing sets of address mismatch bits, based on how those particular portions or modules are mapped into the address space of data processing system 100. Thus, each portion or module may require a different mask value to be used for accesses.

The masking operation can be better understood with reference to an example. In the example, the write address, designated Address A, is associated with a memory location that is also associated with Address B. Address A and Address B differ in value at bit location 22. As indicated by the H-matrix 200 of FIG. 2, bit location 22 is used to calculate the address checkbits at bit locations 7, 6, 4, 2, and 1. Accordingly, the mask stored in the lookup table for Address A (as well as the mask stored for Address B) will, when employed during the ECC checkbit calculation process, prevent the checkbits bits at bit locations 7, 6, 4, 2, and 1 from being impacting by address bit 22 in the final result of the ECC checkbit calculation. In effect, the mask eliminates selected columns from the H-matrix 200 based on the write address. The address values associated with those columns become "don't cares" for the ECC coding scheme.

Figure 4:
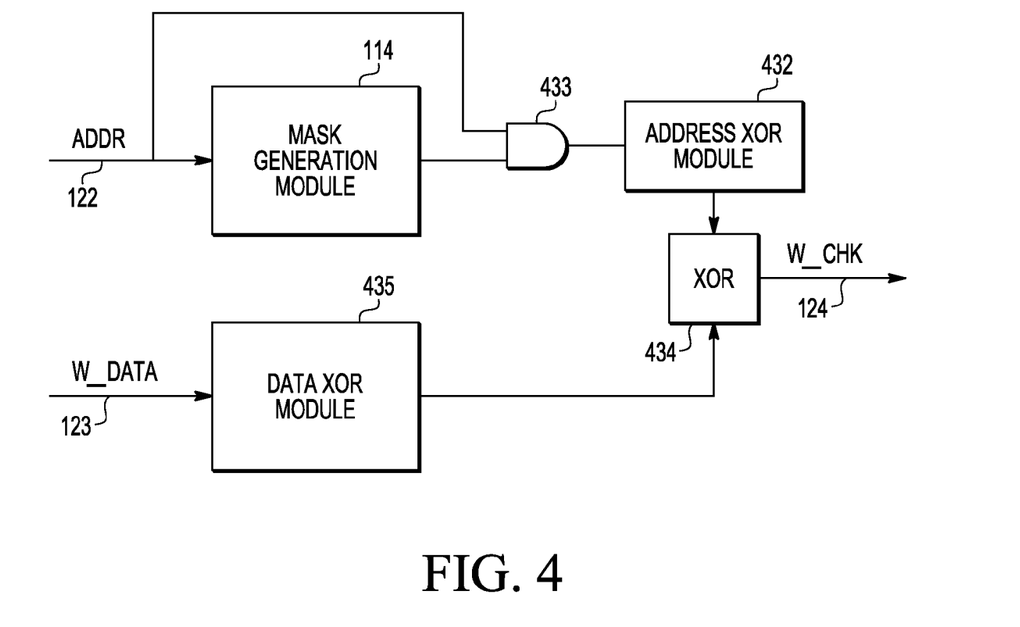
FIG. 4 is a block diagram illustrating a particular embodiment of the ECC checkbit generation logic of FIG. 1.

The mask can be employed at the ECC checkbit generation logic 113 either prior to or after calculation of the address checkbits. This can be better understood with reference to FIGS. 4 and 5, which illustrate portions of the ECC checkbit generation logic 113 in accordance with particular embodiments of the present disclosure. In the illustrated embodiment of FIG. 4, the ECC checkbit generation logic 113 includes an AND gate 433, an address XOR module 432, an XOR module 434, and a data XOR module 435. FIG. 4 also illustrates the mask generation module 114. In the illustrated embodiment, the AND gate includes an input connected to the bus 122 to receive the address, an input to receive the mask from the mask generation module 114, and an output. The address XOR module 432 is connected to the output of the AND gate 433 and to the XOR module 434. The data XOR module 435 is connected to the bus 123 and to the XOR module 434. The XOR module 434 includes an output connected to the bus 124.

In operation, the mask generation module 114 determines a mask based on a received write address, and provides the mask to the AND gate 433. The AND gate 433 combines the mask with write address according to a logical AND operation. The resulting set of bits are provided to the address XOR module 432, which employs a set of XOR operations, as indicated by the H-matrix 200 of FIG. 2, to determine a set of address checkbits. Accordingly, the mask provided by the mask generation module 114 in the embodiment of FIG. 4 is such that, when combined with the write address according to a logical AND operation, any address mismatch bits are prevented from impacting the calculation of the address checkbits by the address XOR module 432. In one embodiment, the provided mask is such that, when combined with the write address according to a logical AND operation, any address mismatch bits are set to a specified value, such as zero. In effect, selected columns of the address portion of the H-Matrix 200 of FIG. 2 are thereby removed from the checkbit generation process based on the write address.

The data XOR module 435 employs a set of XOR operations, as indicated by the H-matrix 200, to calculate a set of data checkbits. The XOR module 434 combines the data checkbits and address checkbits according to an XOR operation to determine the final checkbits for the write access. The final checkbits are provided via the bus 124.

Figure 5:
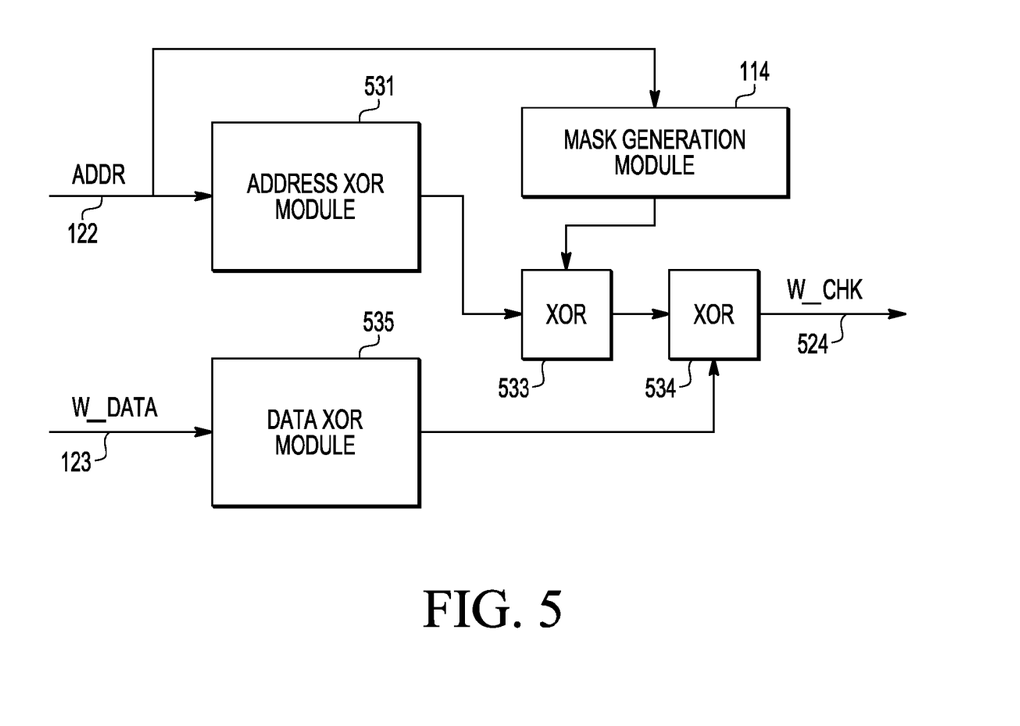
FIG. 5 is a block diagram illustrating another particular embodiment of the ECC checkbit generation logic of FIG. 1.

Referring to FIG. 5, an alternative embodiment of portions of the ECC checkbit generation logic 113 is illustrated. In the illustrated embodiment, the ECC checkbit generation logic 113 includes an address XOR module 531, XOR modules 533, and a data XOR module 535. FIG. 5 also includes mask generation module 114. The address generation module 531 and mask generation module 114 are each connected to the bus 122 to receive the write address. The XOR module 533 is connected to both the mask generation module 114 and the address XOR module 531. The data XOR module is connected to the bus 123 to receive write data. The XOR module 534 is connected to the XOR module 533 and the data XOR module 535, and is also connected to the bus 524 to provide the final ECC checkbits associated with a write access.

In operation, the address XOR module 531 receives the write address associated with a write access. In response, the address XOR module 531 combines the address bits of the write address according to a set of XOR operations as indicated by the full H-matrix 200 of FIG. 2, to determine a set of partial address checkbits. The mask generation module 114 determines a mask based on the write address, and in contrast to the mask generation module of FIG. 4, wherein the mask indicates a submatrix of H-matrix 200 that only includes the columns of the mismatch bits. In an embodiment, the mask is a selector that identifies the submatrix in a submatrix table (not shown), to which the mismatch bits of the write address are applied. The XOR module 533 combines the sub-matrix checkbit outputs provided by mask generation module 114 with the address checkbits provided by address XOR module 531 according to an XOR operation. The effect is that the columns of H-matrix 200 that correspond to mismatch bits are effectively removed, thus any address mismatch bits are prevented from impacting the calculation of the final checkbits by the XOR module 534.

The data XOR module 535 employs a set of XOR operations, as indicated by the H-matrix 200, to calculate a set of data checkbits. The XOR module 534 combines the data checkbits and masked address checkbits according to an XOR operation to determine the final checkbits for the write access. The final checkbits are provided via the bus 124.

Figure 6:
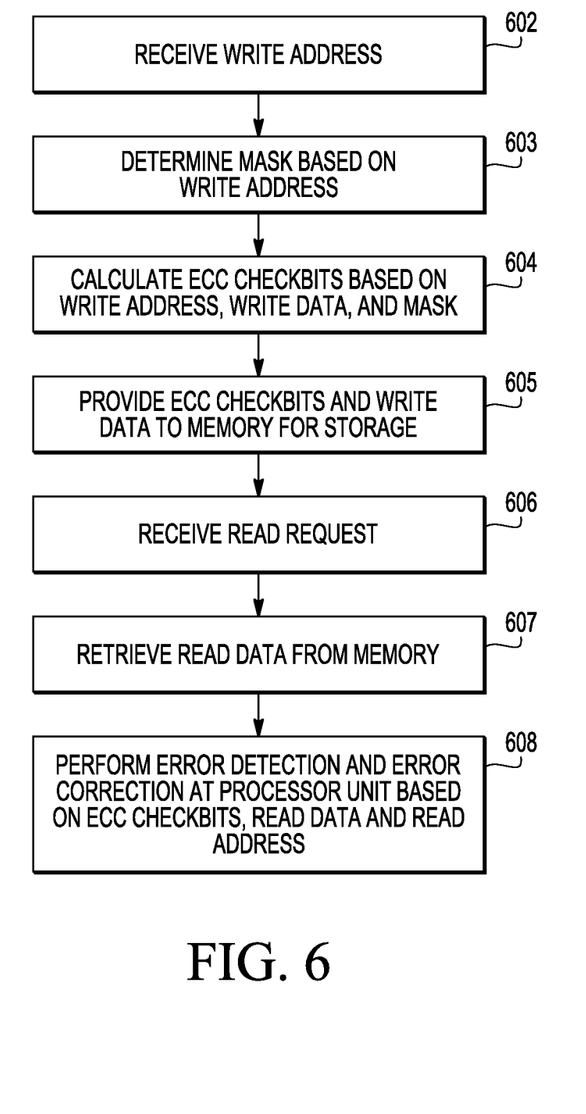
FIG. 6 is a flow diagram of a method of determining ECC checkbits based on a memory address and a mask in accordance with one embodiment of the present disclosure.

FIG. 6 illustrates a flow diagram of a method of determining ECC checkbits at the data processing device 100 in accordance with one embodiment of the present disclosure. At block 602, the ECC checkbit generation logic 113 and mask generation module 114 receive a write address associated with a write access. In response, at block 603 the mask generation module 114 determines a mask based on the write address. In an embodiment, the mask generation module 114 determines the mask by retrieving the mask from an entry in a look-up table, the entry based on the write address. At block 604 the ECC checkbit generation logic calculates ECC checkbits for the write access based on the write address, the write data, and the mask. At block 605 the processor unit provides, via the interconnect 103, the ECC checkbits and the write data to the memory 104 for storage at a memory location.

At block 606 the execution units 110 generate a read request including a read address associated with the memory location. In an embodiment, the read address is different than the write address that caused the read data to be stored at the memory 104. At block 607, the read data and ECC checkbits are retrieved from the memory location and provided, via the interconnect 103, to the ECC correction logic 111 at the processor unit 102. At block 608, the ECC correction logic 111 performs error detection and error correction based on the ECC checkbits, the read data, and the read address. As described earlier, ECC correction logic may contain equivalent masking operations on the read address portion of the H-Matrix used for performing error correction, and thus may ensure that address mismatch bits do not affect the integrity of the error correction process. Alternatively, in an embodiment, at block 607, after the read ECC checkbits are retrieved from the memory storage location, they may be modified by including a set of partial address checkbit values computed using the address portion of the H-Matrix of FIG. 2, based solely on the values of the read address mismatch bits (i.e. using only those columns corresponding to address mismatch bits), using an XOR function prior to providing such modified stored checkbits to interconnect 103. In this embodiment, ECC correction logic does not require masking capabilities.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

As used herein, the term "first" can refer to any selected item, and does not necessarily refer to first in time or first in a particular order. Thus, for example, the term "first checkbit" can refer to any one of a set of checkbits, and does not refer to the placement of a checkbit in time or order.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. In a data processing device comprising a processor unit coupled to a memory, a method comprising:
   receiving a memory access request comprising a memory address and data;
   determining a mask based on the memory address; and
   determining error correction code (ECC) checkbits based on the memory access request and based on the mask, wherein the mask prevents any memory address mismatch bits of the memory access request from impacting the ECC checkbits, wherein the memory address mismatch bits are differences at particular bit locations of different addresses associated with a multiple-mapped memory location.

2. The method of claim 1, wherein:
   determining the ECC checkbits comprises combining a plurality of address bits of the memory address to determine the ECC checkbits; and
   determining the mask comprises:
      in response to the memory address being one of a first set of addresses, selecting the mask such that the ECC checkbits are based on the state of a selected one of the plurality of address bits; and
      in response to the memory address being one of a second set of addresses, selecting the mask such that the ECC checkbits are not based on the state of the selected one of the plurality of address bits.

3. The method of claim 2, wherein combining the plurality of address bits comprises combining the plurality of address bits according to an exclusive-or operation.

4. The method of claim 1, wherein determining the ECC checkbits comprises:
   applying the mask to the memory address according to a first logical operation to determine a first set of bits;
   combining the first set of bits according to a second logical operation to determine a second set of bits; and
   determining the ECC checkbits based on the second set of bits.

5. The method of claim 4, wherein the data comprises a set of data bits, and wherein determining the ECC checkbits comprises:
   combining the set of data bits according to a third logical operation to determine a third set of bits; and
   combining the second set of bits and the third set of bits according to a fourth logical operation to determine the ECC checkbits.

6. The method of claim 1, wherein the memory address comprises a set of memory address bits, and wherein determining the ECC checkbits comprises:
   combining the set of memory address bits according to first logical operation to determine a first set of bits;
   combining the mask with the first set of bits to determine a second set of bits; and
   determining the ECC checkbits based on the second set of bits.

7. The method of claim 6, wherein the data comprises a set of data bits, and wherein determining the ECC checkbits comprises:
   combining the set of data bits according to a third logical operation to determine a third set of bits; and
   combining the second set of bits and the third set of bits according to a fourth logical operation to determine the ECC checkbits.

8. A method, comprising:
   generating at a source module a write access comprising a memory address and data;
   determining at the source module a mask based on the memory address;
   determining at the source module error correction code (ECC) checkbits based on the memory access request and based on the mask, wherein the mask prevents any memory address mismatch bits of the memory access request from impacting the ECC checkbits, wherein the memory address mismatch bits are differences at particular bit locations of different addresses associated with a multiple-mapped memory location;
   providing the data and ECC checkbits via an interconnect for storage at a memory;

receiving the data and the ECC checkbits from the memory at a requesting module via the interconnect in response to a read access; and performing at the requesting module error detection based on the ECC checkbits.

9. The method of claim 8, wherein determining the mask comprises:

in response to the memory address being a first address, selecting the mask such that the ECC checkbits are based on a first set of address bits of the memory address; and in response to the memory address being a second address, selecting the mask such that the ECC checkbits are based on a second set of address bits of the memory address, the first set of address bits different from the second set of address bits.

10. The method of claim 8, wherein determining the ECC checkbits comprises:

applying the mask to the memory address according to a first logical operation to determine a first set of bits;

combining the first set of bits according to a second logical operation to determine a second set of bits; and determining the ECC checkbits based on the second set of bits.

11. The method of claim 10, wherein the data comprises a set of data bits, and wherein determining the ECC checkbits comprises:

combining the set of data bits according to a third logical operation to determine a third set of bits; and combining the second set of bits and the third set of bits according to a fourth logical operation to determine the ECC checkbits.

12. The method of claim 8, wherein the memory address comprises a set of memory bits, and wherein determining the ECC checkbits comprises:

combining the set of memory bits according to first logical operation to determine a first set of bits;

combining the mask with the first set of bits to determine a second set of bits; and determining the ECC checkbits based on the second set of bits.

13. The method of claim 12, wherein the data comprises a set of data bits, and wherein determining the ECC checkbits comprises:

combining the set of data bits according to a third logical operation to determine a third set of bits; and combining the second set of bits and the third set of bits according to a fourth logical operation to determine the ECC checkbits.

14. The method of claim 8, wherein determining the mask comprises looking up the mask in a stored table based on the memory address.

15. A device, comprising:

a mask module to determine a mask based on a received memory address associated with a memory access request; and an ECC module to generate ECC checkbits for the memory access request based on the memory address and the mask, wherein the mask prevents any memory address mismatch bits of the memory access request from impacting the ECC checkbits, wherein the memory address mismatch bits of the memory address are bit locations of the memory address that can vary from a different memory address that accesses a same location as the memory address.

16. The device of claim 15, wherein:

the ECC module is to combine a plurality of address bits of the memory address to determine the ECC checkbits; and the mask module is to:

in response to the memory address being one of a first set of addresses, select a mask such that the ECC checkbits are based on the state of a selected one of the plurality of address bits; and in response to the memory address being one of a second set of addresses, select a mask such that the ECC checkbits are not based on the state of the selected one of the plurality of address bits.

17. The device of claim 15 further comprising a memory comprising a plurality of memory locations.

18. The device of claim 15, wherein the ECC module comprises:

a first logic module to combine the mask and the memory address according to a first logical operation to determine a first set of bits;

a second logic module to combine the first set of bits according to a second logical operation to determine a second set of bits; and a third logic module to determine the ECC checkbits based on the second set of bits.

19. The device of claim 15, wherein the memory address comprises a set of memory bits, and wherein the ECC module comprises:

a first logic module to combine the set of memory bits according to first logical operation to determine a first set of bits;

a second logic module to combine the mask with the first set of bits to determine a second set of bits; and a third logic module to determine the ECC checkbits based on the second set of bits.

20. The method of claim 1, wherein determining the mask comprises looking up the mask in a stored table based on the memory address.

* * * * *